United States Patent [19]
Mitsuhashi

[11] Patent Number: 5,617,310
[45] Date of Patent: Apr. 1, 1997

[54] MULTIPLE OPERATION MODE MICROCONTROLLER

[75] Inventor: Masato Mitsuhashi, Kawasaki, Japan

[73] Assignee: Fujitsu Limited, Kanagawa, Japan

[21] Appl. No.: 405,016

[22] Filed: Mar. 16, 1995

[30]  Foreign Application Priority Data

Apr. 28, 1994 [JP] Japan .................................. 6-092157

[51] Int. Cl.⁶ .................................................. G05B 11/01
[52] U.S. Cl. ............................................................ 364/140
[58] Field of Search ........................... 364/140; 371/22.3; 395/500, 750

[56]  References Cited

U.S. PATENT DOCUMENTS 5,438,672  8/1995  Dey ......................................... 395/500
5,454,114  9/1995  Yach et al. ............................... 395/750
5,455,937  10/1995  Berman et al. ......................... 395/500
5,519,714  5/1996  Nakamura et al. ..................... 371/22.3

*Primary Examiner*—Roy N. Envall, Jr.
*Assistant Examiner*—Yoncha Kundupoglu

[57]  ABSTRACT

A microcontroller capable of operating in any one of several operation modes and includes first latch circuits which latch first mode signals from first external nodes at a first timing and second latch circuits latching second mode signals from the same external nodes at a second timing. Operation modes are switched by using the mode signals stored in the first and second latch circuits, so that a single external node can provide two bits for expressing the operation modes. Thus, the number of bits used to represent the mode signal can be increased without increasing the number of external nodes. Also provided is a microcontroller in which the time required for a test can be reduced by eliminating the waiting period for clock generation to be stabilized.

14 Claims, 6 Drawing Sheets

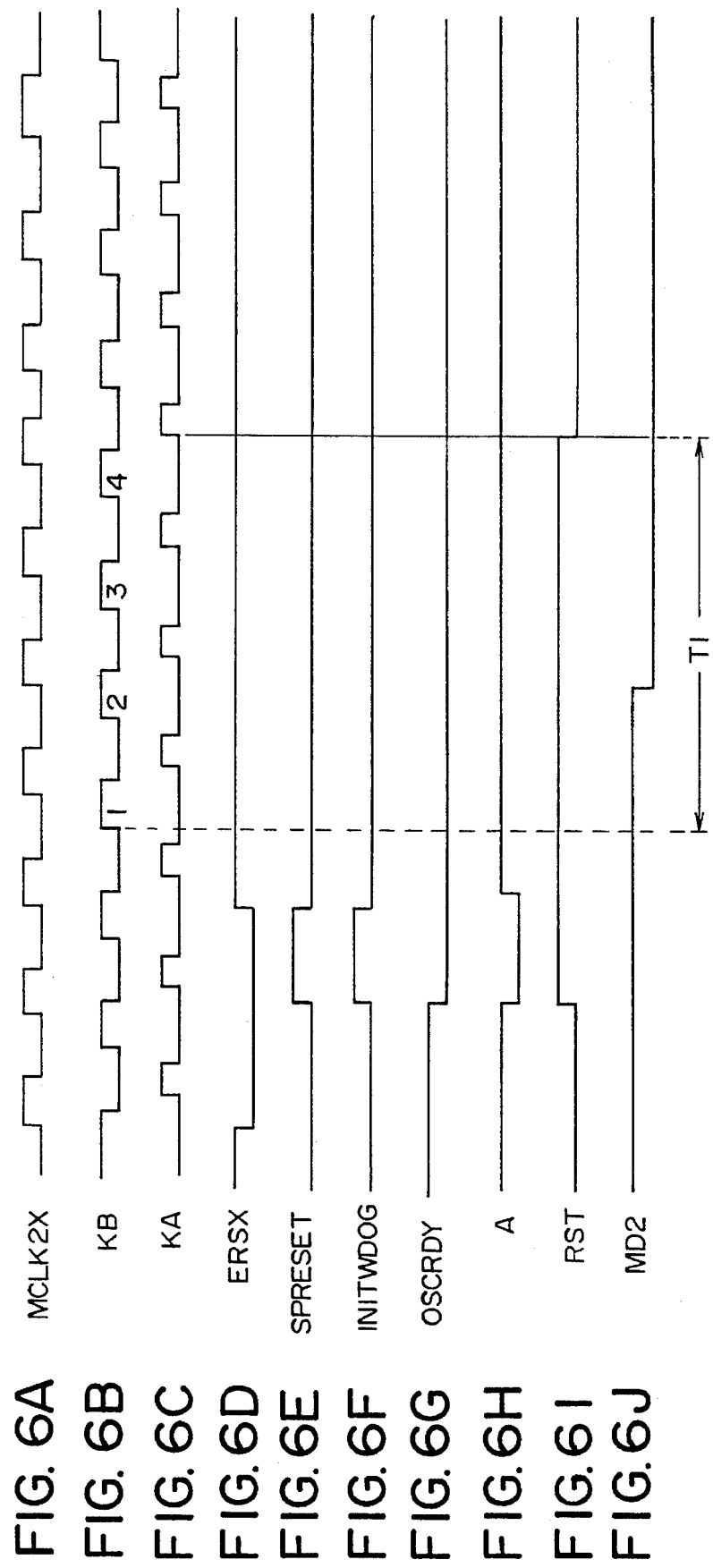

5,617,310

MULTIPLE OPERATION MODE MICROCONTROLLER

BACKGROUND OF THE INVENTION

1. Field of the Invention

The present invention generally relates to microcontrollers, and more particularly relates to a microcontroller which is installed in electronic equipment.

In recent years, there has been a growing demand for electronic products equipped with ever more sophisticated functions, so that various types of the electronic products now incorporate microcontrollers inside. Since these microcontrollers are required to satisfy various demands for the sophisticated functions, they need to be able to operate in various operation modes. Before implementing these microcontrollers inside the products, it is necessary to make a check to determine if the microcontrollers operate as designed in these various operation modes.

Also, the microcontrollers are incorporated into various portable equipment. Thus, some types of the microcontrollers are equipped with a function to halt operation during an idle time, in order to reduce consumption of electric power.

2. Description of the Prior Art

FIG. 1 and FIG. 2 show block diagrams of microcontrollers of the prior art.

In FIG. 1, a clock signal generated by a clock generation circuit 10 is supplied to an internal clock generation circuit 11. The internal clock generation circuit 11 generates various internal clock signals, and provides them for a logic operation circuit 12. A reset signal which holds "1" for a predetermined period of time is supplied externally to a node 15. A time length of the period in which the reset signal is 1 is elongated by a reset elongating circuit 16. Then, the elongated reset signal is provided for the logic operation circuit 12 to reset the same.

Mode signals indicating operation modes are supplied to nodes 17, 18, and 19, and, in turn, provided for latch circuits 20, 21, and 22, respectively. When the elongated reset signal is 1, the latch circuits 20 to 22 receive one of the internal clock signals from an AND circuit 23 so as to latch mode signals from the nodes 17 to 19, respectively. The mode signal from the node 19 indicates either a normal operation or a test operation, and is supplied to the logic operation circuit 12 as an output of the latch circuit 22. Also, the outputs of the latch circuit 20 to 22 are provided for and decoded at an operation mode selection circuit 24. Outputs of the operation mode selection circuit 24 control internal operations of the logic operation circuit 12.

In the microcontroller of FIG. 2, a counter 25 waiting for clock generation to be stabilized is provided in order to wait for the operation of the clock generation circuit 10 to be stabilized upon the power on of the microcontroller. The counter 25 is reset by a reset signal "1" from the node 15, and, then, starts counting the clock signal generated by the clock generation circuit 10. When a count has exceeded a predetermined number, the counter 25 sets a start-up flip-flop 26 provided for the reset elongating circuit 16. The setting of the flip-flop 26 triggers the start of the reset elongating circuit 16, which elongates the reset signal to provide the elongated reset signal for the logic operation circuit 12 and the AND circuit 23.

In the prior-art circuits shown in FIG. 1 and FIG. 2, the nodes 17 to 19 are allocated for the setting of the operation modes, i.e., an operation mode is selected based on signal levels of the nodes 17 to 19 at the time of a reset. In general, there is a restriction on a number of the external nodes which can be provided on a microcontroller chip, often because only a limited space is available at a time of implementation. However, the larger the number of test items which can be set by external nodes, the easier it is to conduct a test. Thus, there are conflicting demands, one for a simplicity in the setting of the operation modes and the other for a smaller number of external nodes.

Also, the prior-art circuit shown in FIG. 2 is provided with the counter 25 for waiting for the clock generation to be stabilized and with the flip-flop 26 to be set by the counter 25. Thus, when a mode is switched at reset from an operation mode to a test mode, the test cannot be conducted in a period during which the counter 25 keeps count of the clock signal. This leads to an increase in a time required for the test.

Accordingly, there is a need in the field of microcontrollers for a microcontroller in which a number of bits representing mode signals for setting operation modes can be increased without increasing a number of external nodes, and, also, a time required for a test can be reduced by eliminating a waiting period for clock generation to be stabilized.

SUMMARY OF THE INVENTION

It is a general object of the present invention to provide a microcontroller which can satisfy the need described above.

It is another and more specific object of the present invention to provide a microcontroller in which a number of bits representing mode signals for setting operation modes can be increased without increasing a number of external nodes.

In order to achieve the above objects according to the present invention, a microcontroller capable of operating in any one of operation modes includes one or more first latch circuits latching first mode signals provided at first external nodes at a first timing, one or more second latch circuits latching second mode signals provided at the first external nodes at a second timing different from the first timing, and a logic operation circuit operating in one of the operation modes upon a reset at the second timing, which one is defined by the first mode signals from the one or more first latch circuits and the second mode signals from the one or more second latch circuits.

In the microcontroller according to the present invention, the first latch circuits latch first mode signals from the first external nodes at the first timing, and the second latch circuits latch second mode signals from the same external nodes at the second timing. Operation modes are switched by using those mode signals stored in the first and second latch circuits, so that a single external node can provide two bits for expressing the operation modes. Thus, the number of bits for the mode signals can be increased without increasing the number of external nodes.

It is yet another object of the present invention to provide a microcontroller in which a time required for a test can be reduced by eliminating a waiting period for clock generation to be stabilized.

In order to achieve the above object according to the present invention, a microcontroller capable of operating in any one of operation modes includes a timing circuit receiving a first signal at a first external node and providing a second signal when the timing circuit is activated, latch circuits latching mode signals provided at second external nodes when the timing circuit provides the second signal, a waiting circuit receiving the first signal at the first external node and activating the timing circuit after waiting a predetermined period of time, an activation circuit activating the timing circuit upon receiving one of the mode signals at a predetermined one of the second external nodes, if that one of the mode signals indicates a test operation mode, and a logic operation circuit operating in one of the operation modes upon receiving the second signal for a reset, which one of the operation modes is defined by the mode signals stored in the latch circuits, wherein the timing circuit provides a time lag before the reset when that one of the mode signals indicates an operation mode other than the test operation mode, but provides no time lag before the reset when that one of the mode signals indicates the test operation mode.

In the microcontroller described above, the test operation mode nullifies the waiting period of the timing circuit which waits for clock generation to be stabilized, so that a test can be conducted without the waiting period. Thus, a time required for the test can be reduced, which is highly advantageous in practice.

Other objects and further features of the present invention will be apparent from the following detailed description when read in conjunction with the accompanying drawings.

BRIEF DESCRIPTION OF THE DRAWINGS

FIGS. 6A to 6J are time charts showing signals of FIG. 5.

DESCRIPTION OF THE PREFERRED EMBODIMENTS

In the following, embodiments of the present invention will be described with reference to the accompanying drawings.

Figure 1:
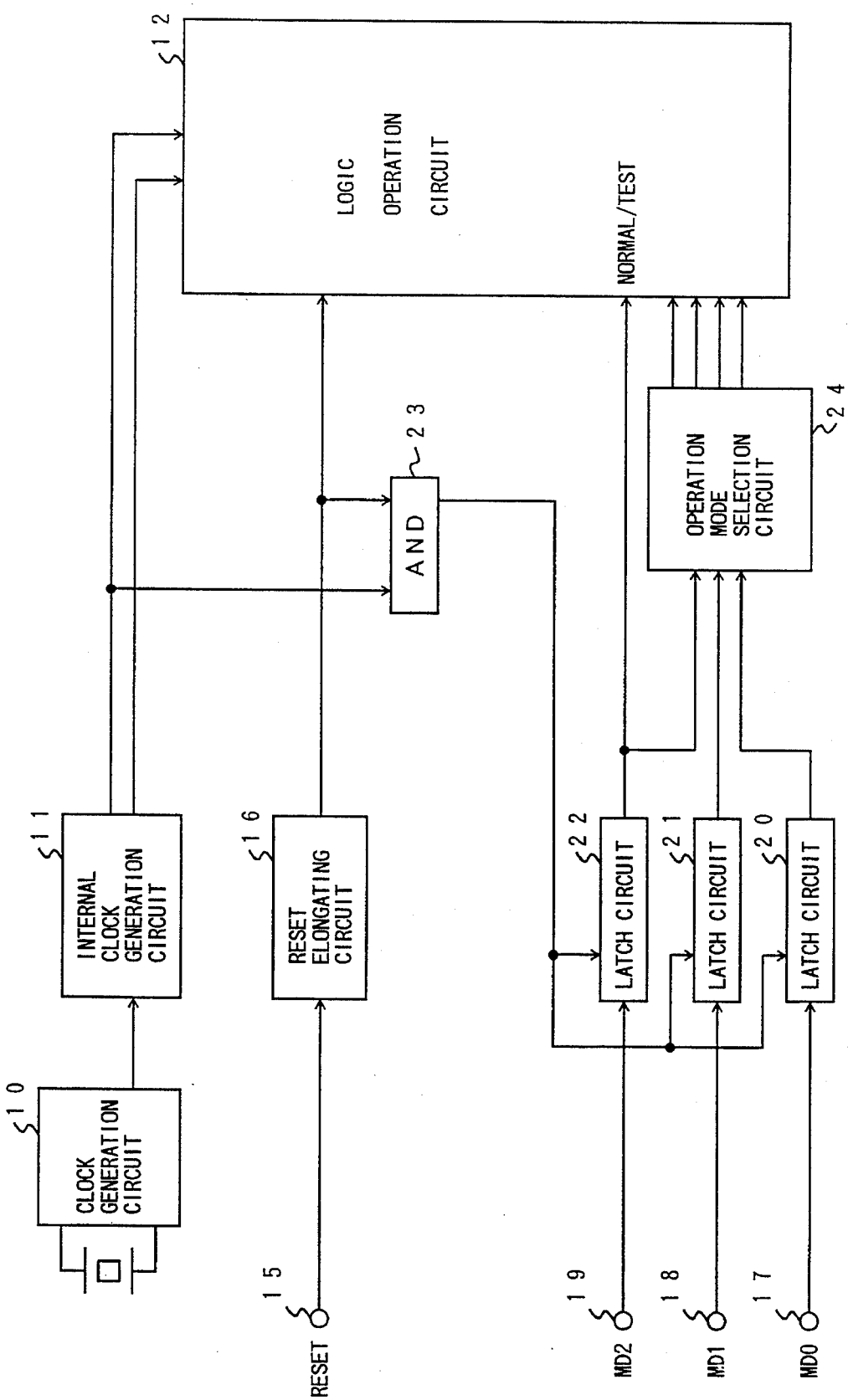
FIG. 1 is a block diagram of a microcontroller of the prior art.
Figure 2:
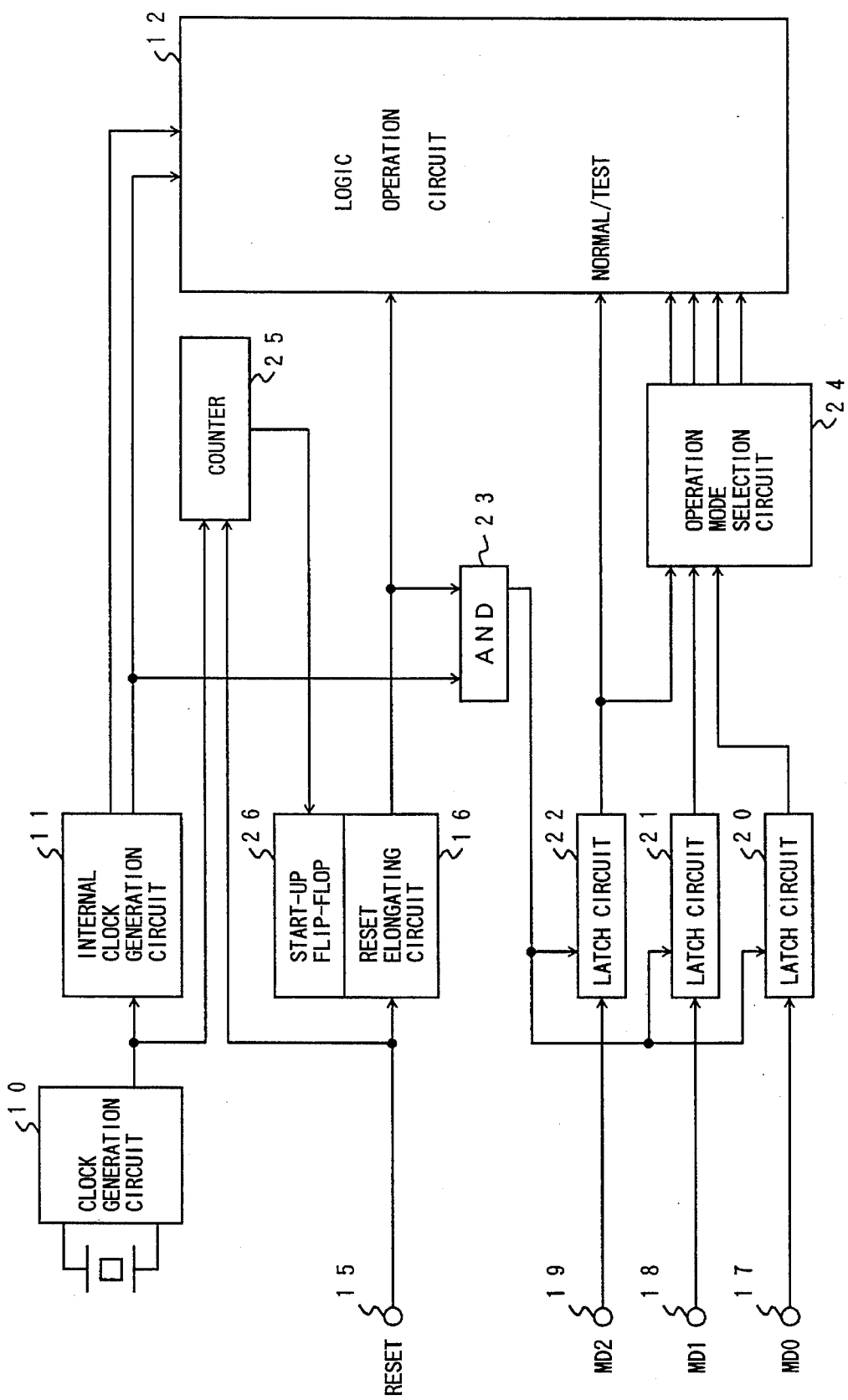
FIG. 2 is a block diagram of another microcontroller of the prior art.
Figure 3:
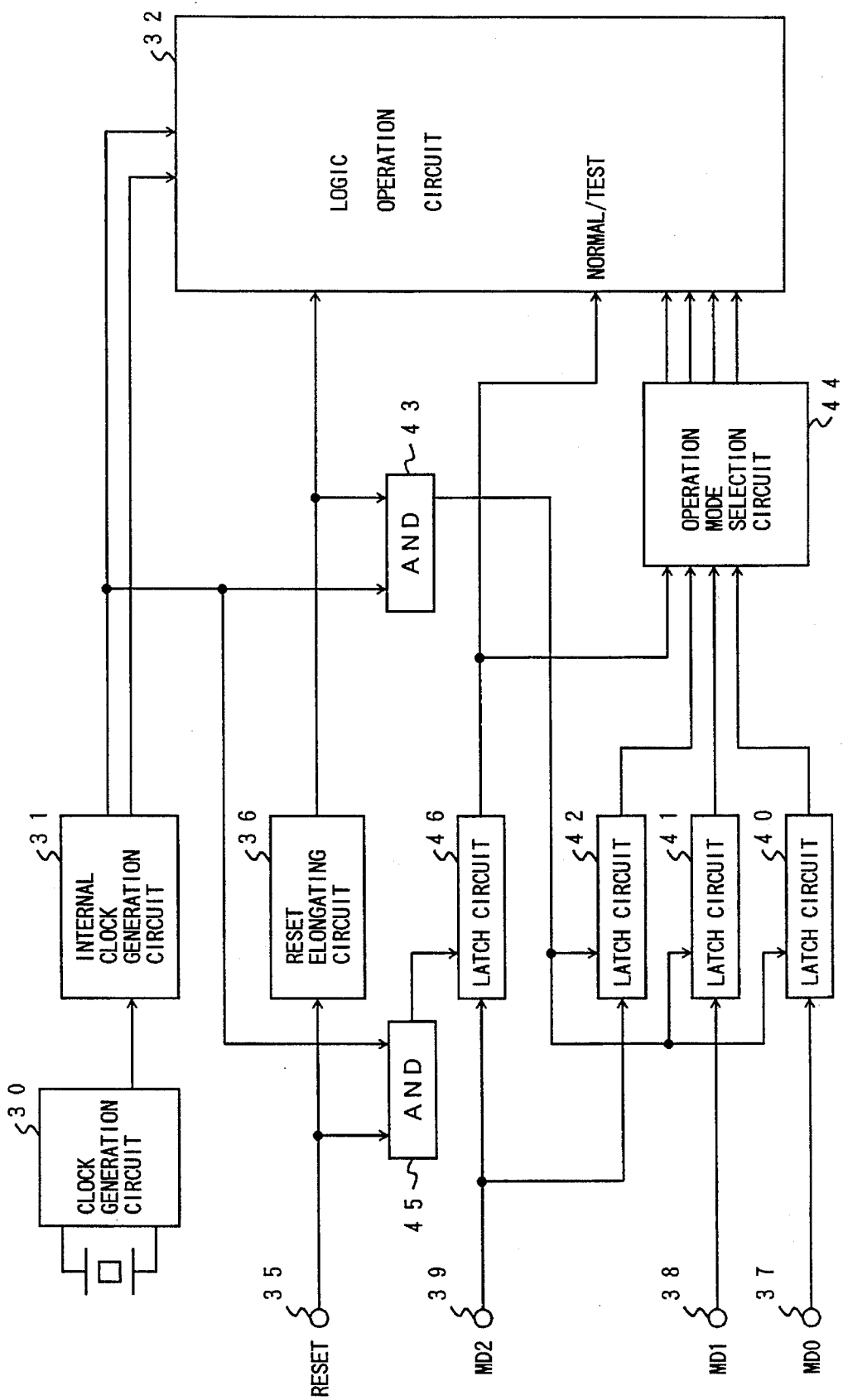
FIG. 3 is a block diagram of a first embodiment of a microcontroller according to the present invention.

FIG. 3 shows a first embodiment of a microcontroller according to the present invention. In FIG. 3, a clock signal generated by a clock generation circuit 30 is supplied to an internal clock generation circuit 31. The internal clock generation circuit 31 generates various types of internal clock signals, and provides them for a logic operation circuit 32. A reset signal holding "1" for a predetermined period of time is supplied externally to a node 35. The reset signal is elongated by a predetermined time length at a reset elongating circuit 36, and, then, provided for the logic operation circuit 32. The logic operation circuit 32 is reset by this elongated reset signal. Here, the length of time elongated by the reset elongating circuit 36 is longer than the period in which the reset signal holds "1".

Mode signals indicating operation modes are supplied to nodes 37, 38, and 39, and, in turn, provided for latch circuits 40, 41, and 42, respectively. The mode signal of the node 39 is also provided for a latch circuit 46. When a reset signal elongated at the reset elongating circuit 36 becomes 1, the latch circuits 40 to 42 receive one of the internal clock signals via an AND circuit 43 so as to latch mode signals from the nodes 37 through 39, respectively. The latch circuit 46 receives one of the internal clock signals via an AND circuit 45, when the other input of the AND circuit 45 is "1". Thus, when the reset signal from the node 35 becomes "1", the latch circuit 46 latches the mode signal from the node 39.

The mode signal latched by the latch circuit 46 is supplied to the logic operation circuit 32 as a signal indicating either a normal operation or a test operation. Also, the same mode signal is applied to an operation mode selection circuit 44. The mode signals latched by the latch circuit 40 to 42 are also provided for the operation mode selection circuit 44. The operation mode selection circuit 44 decodes those mode signals to generate control signals, which are supplied to the logic operation circuit 32. Internal operations of the logic operation circuit 32 are controlled by those control signals.

In order to test the microcontroller, a test operation is indicated at the node 39. For example, while the mode signal of "1" is supplied to the node 39, the reset signal of "1" is applied to the node 35 for a predetermined period of time. Since the reset signal is "1", the internal clock signal is supplied to the latch circuit 46 via the AND circuit 45. Thus, the mode signal of "1" is latched by the latch circuit 46.

Then, while the reset signal of "1" is elongated by the reset elongating circuit 36, mode signals MD0 to MD2 indicating types of tests to be conducted are provided for the nodes 37 to 39, respectively. When the reset signal elongated by the reset elongating circuit 36 becomes 1, one of the internal clock signals is applied to the latch circuits 40 to 42 via the AND circuit 43. Thus, the mode signals MD0 to MD2 are latched by the latch circuits 40 to 42.

In this manner, creating a time difference in latch timing between the latch circuit 46 and the latch circuits 40 to 42 enables an additional one bit of mode signal to be provided from the node 39. Thus, without increasing a number of external nodes, a number of bits expressing the mode signals can be increased for the setting of operation modes. This leads to a test being easily conducted.

Of course, the operation modes can be set in a normal operation as well as in the test operation. Further, the nodes 37 and 38, also, can be provided with latch circuits operating in response to the output from the AND circuit 45. Such latch circuits latch mode signals at the time when a reset signal is applied to the node 35, and provide the mode signals for the operation mode selection circuit 44, thus increasing the number of bits expressing the mode signals.

Figure 4:
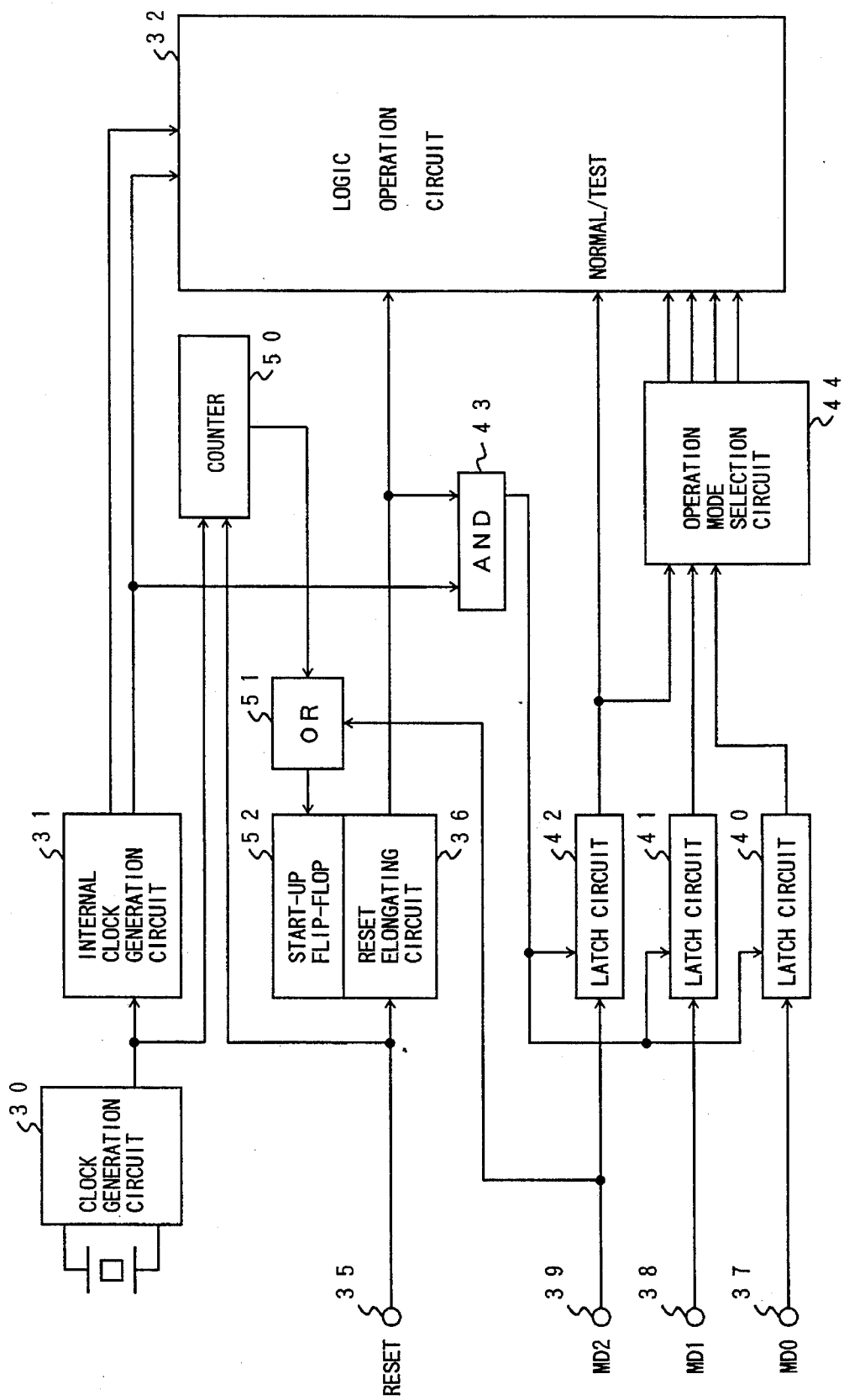
FIG. 4 is a block diagram of a second embodiment of a microcontroller according to the present invention.

FIG. 4 shows a block diagram of a second embodiment of a microcontroller according to the present invention. In FIG. 4, the same elements as those of FIG. 3 are referred to by the same numerals, and description thereof will be omitted.

In FIG. 4, a counter 50 waiting for clock generation to be stabilized is reset when it receives the reset signal of "1" from the node 35. Then, the counter 50 starts counting the clock signal generated by the clock generation circuit 30. The counter 50 provides the set signal of "1" when a count becomes a predetermined number indicating the stability of the operation of the clock generation circuit 30.

This set signal of "1" is supplied via an OR circuit 51 to a start-up flip-flop 52, which is provided for the reset elongating circuit 36. The flip-flop 52 is set by the set signal. The reset elongating circuit 36 elongates the reset signal provided from the node 35, only when the flip-flop 52 is set. In the normal operation mode, therefore, the reset elongating circuit 36 delays the reset signal from the node 35, and provides the elongated reset signal for the logic operation circuit 32 only after the operation of the clock generation circuit 30 is stabilized.

The node 39 receives a mode signal indicating the normal operation by "0" and the test operation by "1", which is supplied to the latch circuit 42 and the OR circuit 51. In the test operation mode, therefore, the mode signal of "1" indicating the test operation is supplied to the start-up flip-flop 52 via the OR circuit 51. Thus, the reset elongating circuit 36 can be activated, without waiting for the counter 50 to generate the set signal of "1" after it is reset by the reset signal. When the reset elongating circuit 36 generates the reset signal of 1, one of the internal clock signals is supplied to the latch circuits 40 to 42 via the AND circuit 43. As a result, the latch circuits 40 to 42 latch the mode signals MD0 to MD2 provided from the nodes 37 through 39, respectively. The mode signal MD2 latched by the latch circuit 42 is supplied to the logic operation circuit 32 so as to set it to the test operation mode. Also, the same mode signal MD2 is supplied to the operation mode selection circuit 44.

Figure 5:
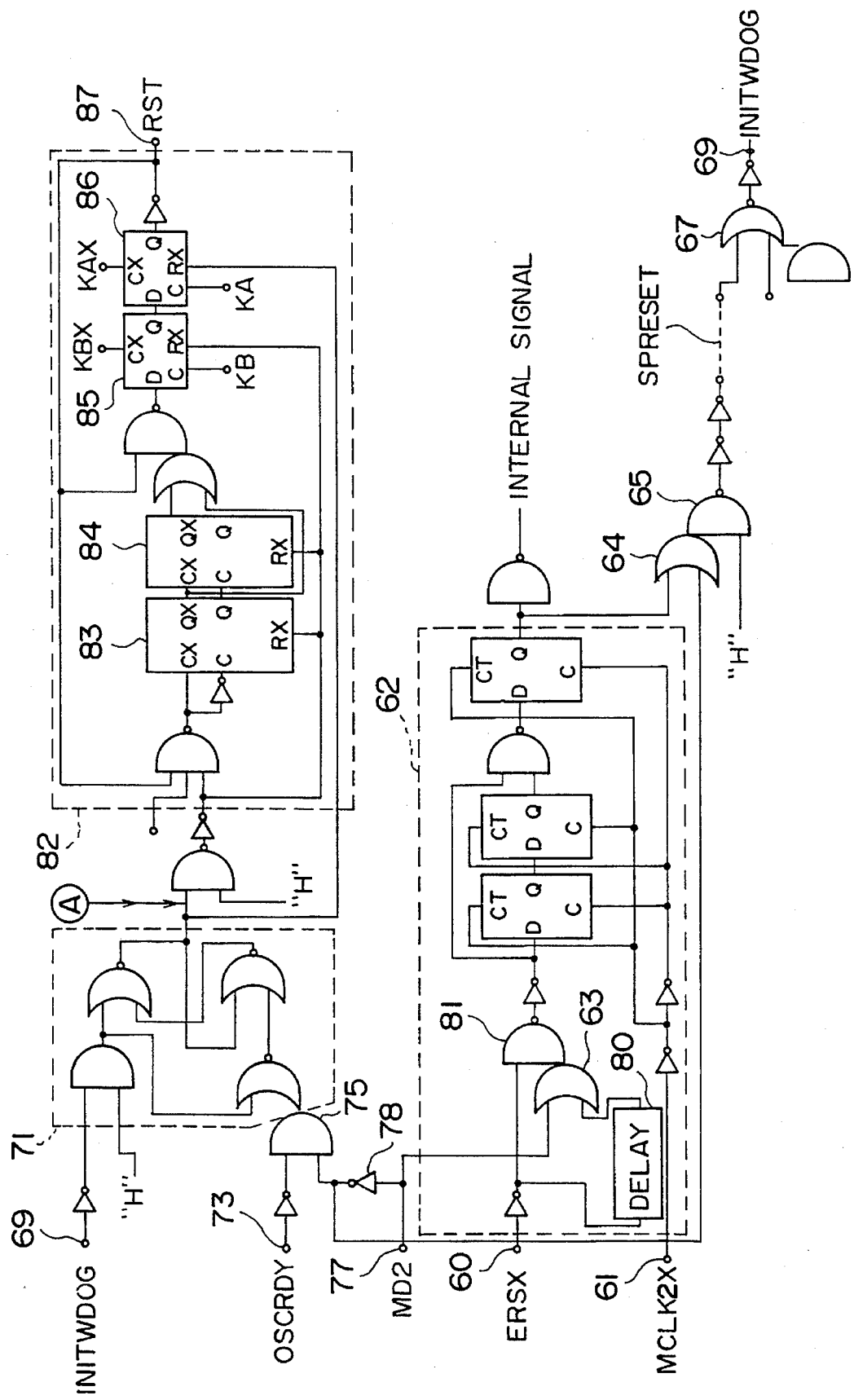
FIG. 5 is a circuit diagram showing a main part of the microcontroller shown in FIG. 4.

FIG. 5 shows a circuit diagram of a main part of the microcontroller shown in FIG. 4. In FIG. 5, a node 60 corresponds to the node 35 of FIG. 4, and receives a signal ERSX, which is a reversed signal of the reset signal and is shown in FIG. 6D. A node 61 receives an internal clock MCLK2X shown in FIG. 6A. The signal ERSX whose noise is removed at a noise removal circuit 62 passes through an OR circuit 64 and a NAND circuit 65 to become a signal SPRESET, which is shown in FIG. 6E. The signal SPRESET further passes through a NOR circuit 67 to become a signal INITWDOG shown in FIG. 6F. The signal INITWDOG is supplied via a node 69 to a flip-flop 71 as a set signal, where the flip-flop 71 corresponds to the start-up flip-flop 52 of FIG. 4. Also, the signal INITWDOG is provided for the counter 50 of FIG. 4.

The counter 50 waiting for clock generation to be stabilized starts counting the clock signal at the positive edge of the signal INITWDOG. The counter 50 generates a signal OSCRDY shown in FIG. 6G, which turns into "1" when a count has exceeded a predetermined number. The signal OSCRDY is supplied to a reset node of the flip-flop 71 via a node 73 and an AND circuit 75.

A node 77 corresponds to the node 39 of FIG. 4, and receives the mode signal MD2, shown in FIG. 6J, which indicates the test operation mode by "1". The mode signal MD2 is supplied to an OR circuit 63 of the noise removal circuit 62, and, also, is reversed by an inverter 78 to be provided for the AND circuit 75 and the OR circuit 64. When the signal MD2 is "1" the OR circuit 63 prevents the noise removal circuit 62 from removing noises at edges of the signal ERSX by using the delay circuit 80 and the NAND circuit 81. The OR circuit 64 and the NAND circuit 65, when the signal MD2 is "0", ensure that the signal SPRESET does not become "1". This signal SPRESET is used at the time of power up.

The AND circuit 75 operates in a negative logic, and corresponds to the OR circuit 51 of FIG. 4. When the signal MD2 is "1" the flip-flop 71 is reset even if the signal OSCRDY is not "1". As shown in FIG. 6H, an output of the flip-flop 71 becomes high at the negative edge of the signal INITWDOG, thereby activating a reset elongating circuit 82. The reset elongating circuit 82 corresponds to that of FIG. 4, and is comprised of flip-flops 83, 84, 85, and 86. The flip-flops 85 and 86 are provided with internal clocks KB and KA, respectively, in order to synchronize signal changes. The internal clocks KB and KA are shown in FIG. 6B and FIG. 6C, respectively. At a positive edge of the signal INITWDOG, the reset elongating circuit 82 turns a reset signal RST at a node 87 to "1" as shown in FIG. 6I. Starting from the time when the output of the flip-flop 71 (FIG. 6H) becomes "1", the reset signal RST waits for the passage of four internal clocks KB before it is turned to "0" at a positive edge of the internal clock KA. It is this reset signal RST which is supplied to the logic operation circuit 32.

In this manner, the reset of the logic operation circuit 32 is delayed in the normal operation mode until the operation of the clock generation circuit 30 becomes stable. In the test operation mode, on the other hand, the logic operation circuit 32 can be reset without waiting for the counter 50 to generate the set signal. Thus, a time required for the test can be reduced.

The first embodiment and the second embodiment may be combined together. In this case, since the reset elongating circuit 82 of the second embodiment counts four clocks of the internal clock KB, the mode signal MD2 can be switched during a time period T1 indicated below FIG. 6J.

As described above, in the microcontroller of the first embodiment, a latch circuit latches a mode signal from an external node while the reset signal is elongated to hold "1" and another latch circuit latches another mode signal from the same external node while the reset signal before elongation is holding "1". Operation modes are switched by using these mode signals stored in these two latch circuits, so that a single external node can provide two bits for expressing the operation modes. Thus, a number of bits for the mode signals can be increased without increasing a number of external nodes.

In the microcontroller of the second embodiment, the test operation mode nullifies the waiting period of a circuit which waits for clock generation to be stabilized, so that a test can be conducted without the waiting period. Thus, a time required for the test can be reduced, which is highly advantageous in practice.

Further, the present invention is not limited to these embodiments, but various variations and modifications may be made without departing from the scope of the present invention.

What is claimed is:

1. A microcontroller capable of operating in any one of operation modes, said microcontroller comprising:

one or more first latch circuits latching first mode signals provided at first external nodes at a first timing;

one or more second latch circuits latching second mode signals provided at said first external nodes at a second timing different from said first timing; and a logic operation circuit operating in one of said operation modes upon a reset at said second timing, which one is defined by said first mode signals from said one or more first latch circuits and said second mode signals from said one or more second latch circuits.

2. The microcontroller as claimed in claim 1, further comprising a timing circuit receiving a first signal at a second external node and providing a second signal, wherein said first signal indicates said first timing, and said second signal indicates said second signal.

3. The microcontroller as claimed in claim 2, further comprising a clock generation circuit generating internal clock signals, wherein said logic operation circuit, said first latch circuits, and said second latch circuits operate by said internal clock signals.

4. The microcontroller as claimed in claim 3, further comprising an operation mode selection circuit receiving said first mode signals and said second mode signals and controlling said logic operation circuit to operate in said one of said operation modes.

5. The microcontroller as claimed in claim 2, wherein said timing circuit comprises a reset elongating circuit receiving said first signal at said second external node and elongating said first signal to provide said second signal.

6. The microcontroller as claimed in claim 5, wherein said one or more first latch circuits latch said first mode signals while said first signal is being provided at said second external node, and said one or more second latch circuits latch said second mode signals while said second signal is being provided by said reset elongating circuit.

7. A microcontroller capable of operating in any one of operation modes, said microcontroller comprising:

a timing circuit receiving a first signal at a first external node and providing a second signal when said timing circuit is activated;

latch circuits latching mode signals provided at second external nodes when said timing circuit provides said second signal;

a waiting circuit receiving said first signal at said first external node and activating said timing circuit after waiting a predetermined period of time;

an activation circuit activating said timing circuit upon receiving one of said mode signals at a predetermined one of said second external nodes, if said one of said mode signals indicates a test operation mode; and a logic operation circuit operating in one of said operation modes upon receiving said second signal for a reset, which one of said operation modes is defined by said mode signals stored in said latch circuits, wherein said timing circuit provides a time lag before said reset when said one of said mode signals indicates an operation mode other than said test operation mode, but provides no time lag before said reset when said one of said mode signals indicates said test operation mode.

8. The microcontroller as claimed in claim 7, further comprising a clock generation circuit generating internal clock signals, wherein said logic operation circuit and said latch circuits operate by said internal clock signals.

9. The microcontroller as claimed in claim 8, further comprising an operation mode selection circuit receiving said mode signals from said latch circuits and controlling said logic operation circuit to operate in said one of said operation modes.

10. The microcontroller as claimed in claim 7, wherein said timing circuit comprises a reset elongating circuit receiving said first signal at said first external node and elongating said first signal to provide said second signal.

11. A device comprising:

nodes;

one or more first latches latching first mode signals provided at said nodes at first timing;

one or more second latches latching second mode signals provided at said node at second timing different from said first timing; and a logic operation circuits operating at one of different modes, which one is defined by said first mode signals from said one or more first latches and said second mode signals from said one or more second latches.

12. The device as claimed in claim 11, comprising a microcontroller.

13. A method of selecting an operation mode for a microcontroller capable of operating in any one of operation modes, said method comprising:

latching first mode signals provided at external nodes at a first timing;

latching second mode signals provided at said external nodes at a second timing different from said first timing; and operating in one of said operation modes upon a reset at said second timing, which one is defined by said first mode signals and said second mode signals.

14. A method of selecting an operation mode for a microcontroller capable of operating in any one of operation modes, said method comprising:

a) receiving a first signal at a first external node;

b) generating a second signal after a passage of a predetermined period of time since said receiving of said first signal;

c) generating said second signal after said receiving of said first signal at a moment when one of mode signals indicating a test operation mode is received at a predetermined one of second external nodes;

d) latching said mode signals provided at said second external nodes when said second signal is generated;

e) operating in one of said operation modes after a reset initiated by said second signal, which one of said operation modes is defined by said mode signals latched at said step d), wherein a time lag of said predetermined period is provided between said receiving of said first signal and said reset for an operation mode other than said test operation mode.

* * * * *